(12) United States Patent
Iwashita et al.

(10) Patent No.: US 7,965,017 B2
(45) Date of Patent: Jun. 21, 2011

(54) THIN FILM PIEZOELECTRIC RESONATOR AND METHOD FOR MANUFACTURING THE SAME

(75) Inventors: Kazuki Iwashita, Ube (JP); Keigo Nagao, Ube (JP); Shinji Fukuda, Ube (JP)

(73) Assignee: UBE Industries, Ltd., Yamaguchi (JP)

( * ) Notice: Subject to any disclaimer, the term of this patent is extended or adjusted under 35 U.S.C. 154(b) by 199 days.

(21) Appl. No.: 12/438,794

(22) PCT Filed: Aug. 24, 2007

(86) PCT No.: PCT/JP2007/066425
§ 371 (c)(1),
(2), (4) Date: Feb. 25, 2009

(87) PCT Pub. No.: WO2008/032543
PCT Pub. Date: Mar. 20, 2008

(65) Prior Publication Data
US 2009/0322186 A1    Dec. 31, 2009

(30) Foreign Application Priority Data

Aug. 25, 2006  (JP) .................................. 2006-229206

(51) Int. Cl.
*H01L 41/09* (2006.01)
(52) U.S. Cl. ...................................................... 310/321
(58) Field of Classification Search .................. 310/328, 310/311, 321, 364–65, 324, 322, 320, 363, 310/348; 333/187, 189; *H01L 41/08, 41/09*
See application file for complete search history.

(56) References Cited

U.S. PATENT DOCUMENTS

| 4,642,508 A * | 2/1987 | Suzuki et al. ................. 310/321 |
| 6,842,088 B2 * | 1/2005 | Yamada et al. ............... 310/322 |
| 6,936,837 B2 * | 8/2005 | Yamada et al. ............... 333/189 |
| 2005/0093397 A1 * | 5/2005 | Yamada et al. ............... 310/320 |

FOREIGN PATENT DOCUMENTS

| JP | 64-073079 A | 3/1989 |
| JP | 07-335880 A | 12/1995 |
| JP | 2001-177101 A | 6/2001 |
| JP | 2001-345320 A | 12/2001 |
| JP | 2003-347883 A | 12/2003 |
| JP | 2005-236338 A | 9/2005 |

* cited by examiner

*Primary Examiner* — Thomas M Dougherty
*Assistant Examiner* — Karen Addison
(74) *Attorney, Agent, or Firm* — Frommer Lawrence & Haug, LLP; Ronald R. Santucci

(57) ABSTRACT

A thin film piezoelectric resonator suppresses deterioration of impedance at antiresonant frequency and has a high Q value. The thin film piezoelectric resonator is provided with a semiconductor substrate (8); an insulating layer (6) formed on the semiconductor substrate (8) in contact with the surface of the semiconductor substrate; and a piezoelectric resonator stack (14) formed above the insulating layer and having a lower electrode (10), a piezoelectric layer (2) and an upper electrode (12) in this order from the insulating layer side. An oscillation space (4) is formed corresponding to an oscillation region where the lower electrode (10) and the upper electrode (12) of the piezoelectric resonator stack (14) overlap each other in the thickness direction. The fixed charge density in the insulating layer (6) is $1 \times 10^{11}$ cm$^{-2}$ or less. At the time of manufacturing the thin film piezoelectric resonator, the insulating layer is formed in contact with the semiconductor substrate and then, heat treatment at 300° C. or higher is performed under non-oxygenated atmosphere.

8 Claims, 7 Drawing Sheets

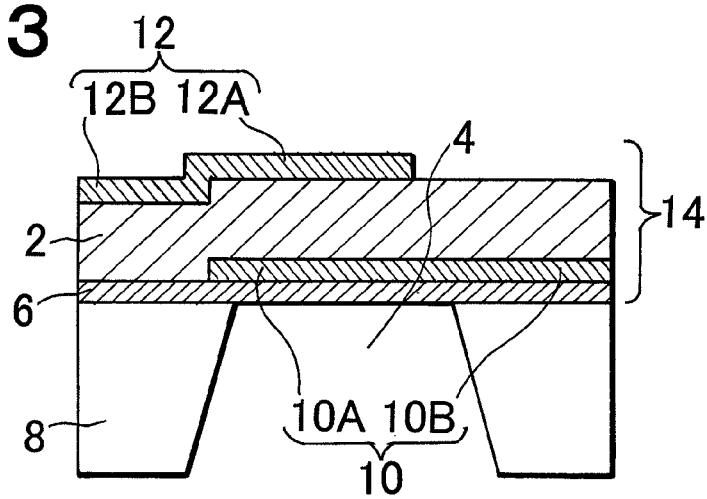
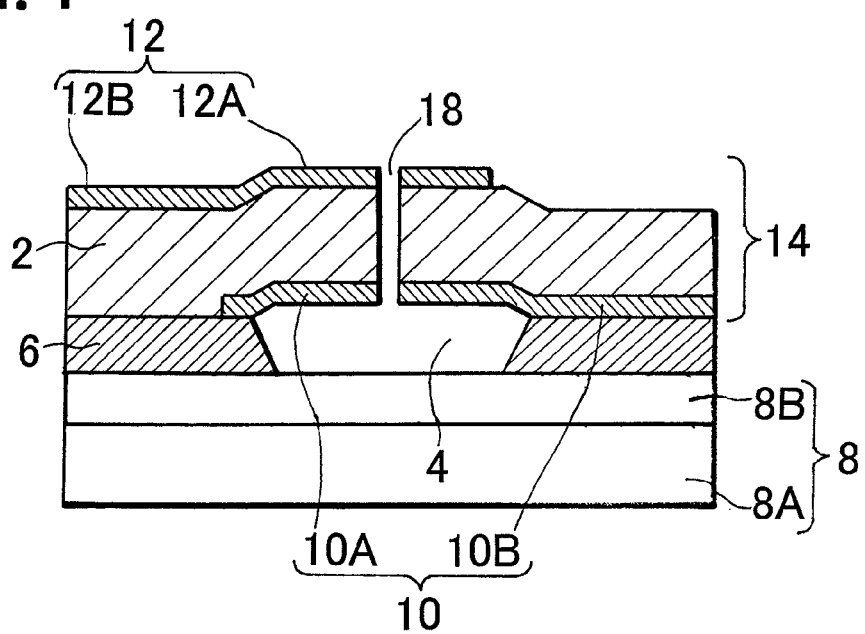

C-V CURVE IN n-TYPE SEMICONDUCTOR SUBSTRATE

C-V CURVE IN p-TYPE SEMICONDUCTOR SUBSTRATE

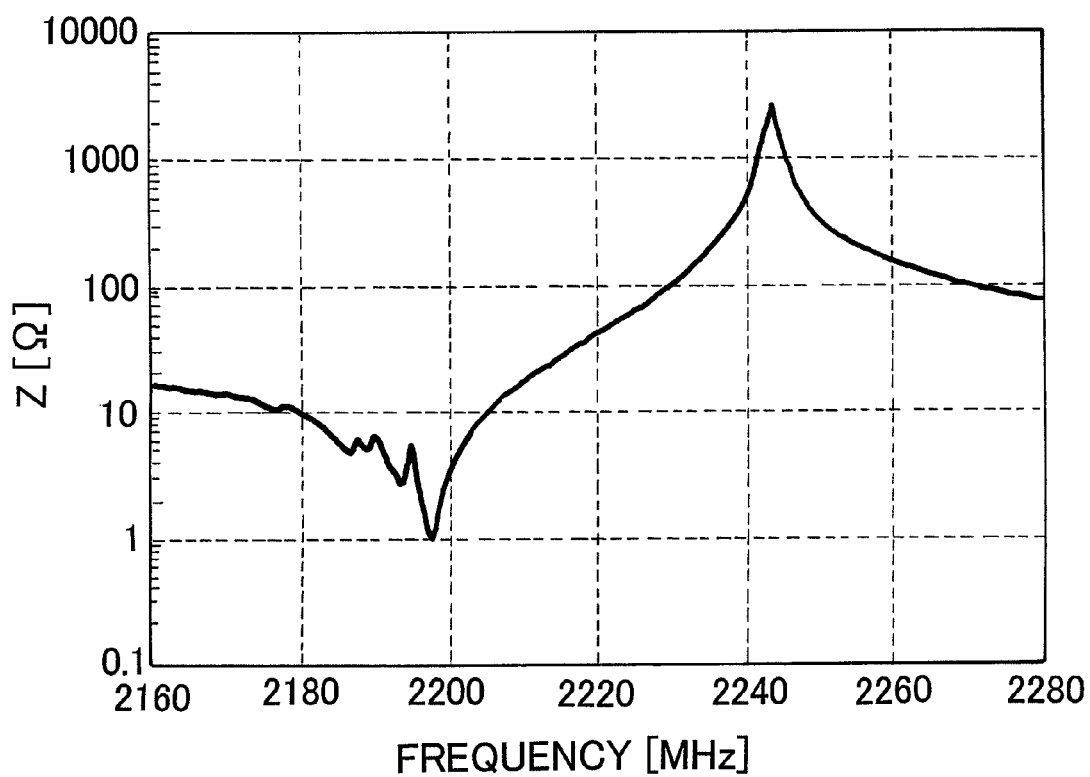

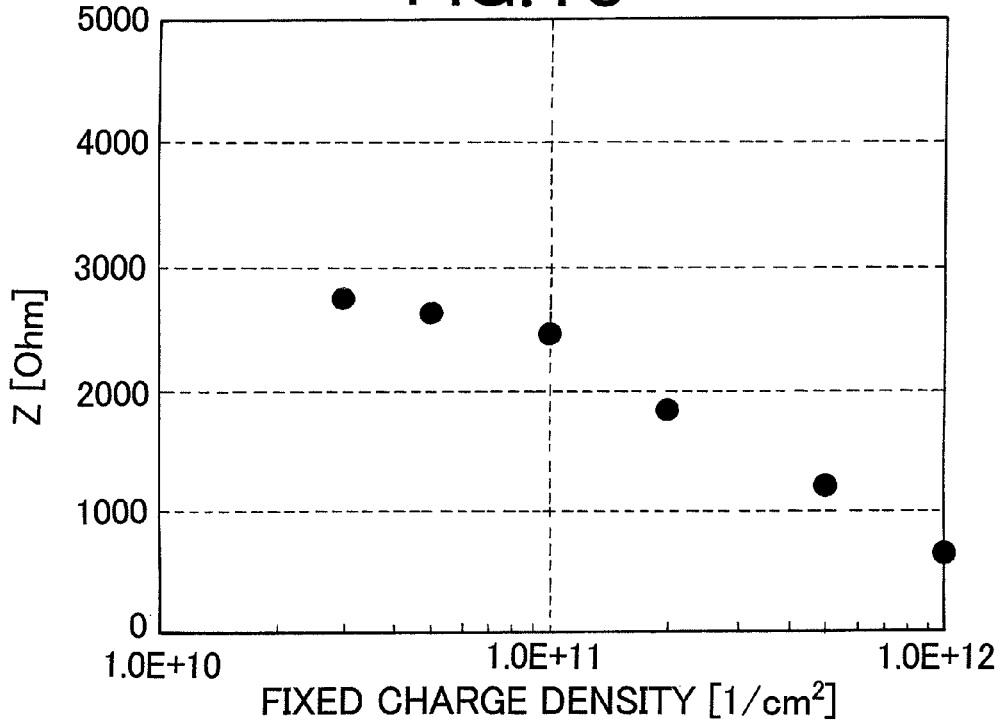
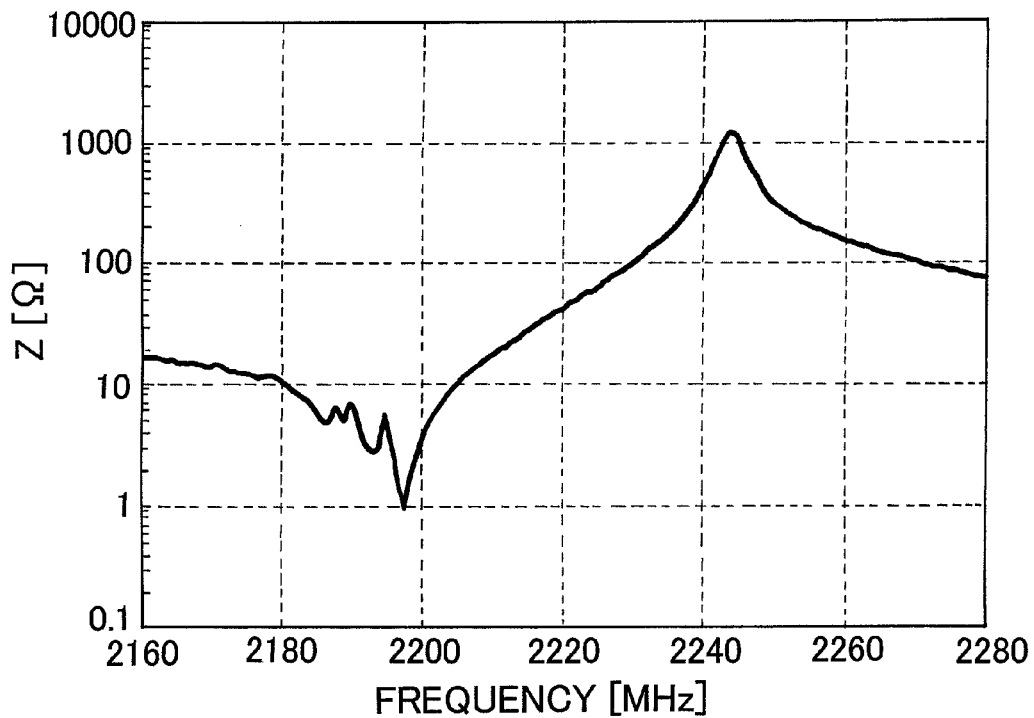

ial No. 2006-229206 filed
THIN FILM PIEZOELECTRIC RESONATOR AND METHOD FOR MANUFACTURING THE SAME This application is a 371 of PCT/JP2007/066425 filed on Aug. 24, 2007, published on Mar. 20, 2008 under publication number WO 2008/032543 A which claims priority benefits from Japanese Patent Application No. 2006-229206 filed Aug. 25, 2006, the disclosure of which is hereby incorporated by reference.

TECHNICAL FIELD

The present invention relates to a thin film piezoelectric resonator and method for manufacturing the same. The thin film piezoelectric resonator is used to constitute, e.g., a communication device.

BACKGROUND ART

Miniaturization is always required in the design of an RF circuit of a communication device such as a cellular phone. In recent years, the cellular phone is required to implement various functions and, to this end, it is preferable to incorporate as many components as possible in the device. However, there is a limitation in the size of the cellular phone, which makes it difficult to reduce the occupying area (mounting area) and height dimension of the RF circuit within the communication device. Thus, the components constituting the RF circuit are required to be small in terms of the occupying area and height dimension.

Under such circumstances, a thin film piezoelectric filter formed using a thin film piezoelectric resonator which is compact and capable of reducing weight has come to be utilized as a bandpass filter used in the RF circuit. The thin film piezoelectric resonator has a structure in which a piezoelectric layer made of aluminum nitride (AlN), zinc oxide (ZnO) or the like is formed on a semiconductor substrate in a sandwiched manner between upper and lower electrodes, and an oscillation space or an acoustic reflecting layer is formed immediately under the piezoelectric layer so as to prevent an elastic wave energy from propagating into the semiconductor substrate.

As described above, the thin film piezoelectric resonator can roughly divided into two types. The first one is a Film Bulk Acoustic Resonator (FBAR) having a structure in which a cavity is formed immediately under a piezoelectric resonator stack including an upper electrode, a lower electrode and a piezoelectric layer. The second one is a Surface Mounted Resonator (SMR) having a structure in which a piezoelectric resonator stack is formed on an acoustic reflecting layer obtained by alternately stacking two layers having different acoustic impedances on a substrate.

Non-Patent Documents 1 and 2 point out that the thin film piezoelectric resonators described above are subject to deterioration in terms of resonator characteristics, especially, subject to reduction in the impedance at the antiresonant frequency due to influence of conductivity of the semiconductor substrate. Further, Patent Document 1 proposes a method that forms an insulating layer on the entire upper surface of the semiconductor substrate so as to reduce the influence of the conductivity of the semiconductor substrate against the resonator characteristics.

Patent Document 1: JP-A-2003-318696
Non-Patent Document 1: "INFLUENCE OF SUBSTRATE CONDUCTIVITY ON CHARACTERISTICS OF ZnO/SiO$_2$-DIAPHRAGM PIEZOELECTRIC RESONATORS", Electron Letters, 1983, vol. 19, pp. 521-522
Non-Patent Document 2: "TEMPERATURE COMPENSATED HIGH COUPLING AND HIGH QUALITY FACTOR ZnO/SiO$_2$ BULK WAVE RESONATORS ON HIGH RESISTANCE SUBSTRATES", Proceedings of IEEE Ultrasonics Symposium 1984, pp. 405-410

DISCLOSURE OF THE INVENTION

Problems to be Solved by the Invention

The thin film piezoelectric filter is required to reduce insertion loss in the pass band while to increase attenuation in the region other than the pass band. In other words, the thin film piezoelectric filter is required to reduce the impedance at the resonant frequency while to increase a Q value and, at the same time, required to increase the impedance at the antiresonant frequency and to increase a Q value.

As described above, the resonant characteristics of the thin film piezoelectric resonator, especially, the impedance at the antiresonant frequency is influenced by the conductivity of the semiconductor substrate that supports the piezoelectric resonator stack. By employing a method disclosed in Non-Patent Document 2 in which a high resistance GaAs substrate is used as a semiconductor substrate, the influence of the conductivity of the semiconductor substrate against the resonant characteristics can be reduced. However, the GaAs substrate is more expensive than a Si substrate. Further, an increase in the wafer size is difficult in the GaAs substrate, which makes cost reduction difficult as well.

Further, even if a structure disclosed in Patent Document 1 in which an insulating layer is formed on the semiconductor substrate and a piezoelectric resonator stack is formed on the insulating layer is adopted for the thin film piezoelectric resonator, deterioration in the resonator characteristics of the thin film piezoelectric resonator, especially, reduction in the impedance at the antiresonant frequency cannot sufficiently be suppressed and, therefore, improvement in characteristics of the thin film piezoelectric filter is still insufficient.

The present invention has been made in view of the above situation, and an object thereof is to provide a thin film piezoelectric resonator suppressing reduction in the impedance at the antiresonant frequency and having a high Q value.

Means for Solving the Problems

According to the present invention, there is provided a thin film piezoelectric resonator comprising:
a semiconductor substrate;
an insulating layer formed on the semiconductor substrate in contact with a surface of the semiconductor substrate; and
a piezoelectric resonator stack formed above the insulating layer and having a lower electrode, a piezoelectric layer and an upper electrode in this order from the insulating layer side,
wherein a fixed charge density in the insulating layer is $1\times10^{11}$ cm$^{-2}$ or less.

In an aspect of the present invention, the insulating layer is formed of an insulating material mainly containing at least one material selected from the group consisting of silicon dioxide, silicon nitride, silicon oxynitride, aluminum nitride, aluminum oxynitride, aluminum oxide, zirconium oxide and tantalum oxide.

In an aspect of the present invention, the insulating layer has a thickness of 0.01 μm to 3.0 μm.

In an aspect of the present invention, the semiconductor substrate is a single crystal silicon substrate having a surface of crystal orientation of (100).

In an aspect of the present invention, the semiconductor substrate is a substrate in which a non-doped polycrystalline silicon layer is formed on a surface of a single crystal silicon substrate, and the insulating layer is formed on the non-doped polycrystalline silicon layer.

In an aspect of the present invention, the electrical resistivity of the semiconductor substrate is 2000 Ω·cm or more.

In an aspect of the present invention, the piezoelectric resonator stack has, above the upper electrode or under the lower electrode, a dielectric layer mainly containing at least one material selected from the group consisting of aluminum nitride, aluminum oxynitride, silicon nitride, and sialon.

Further, according to the present invention, there is provided a method for manufacturing the above thin film piezoelectric resonator, comprising:

forming an insulating layer on a semiconductor substrate in contact with a surface of the semiconductor substrate; and then performing thermal treatment at 300° C. or more under non-oxidizing gas atmosphere.

Further, according to the present invention, there is provided a method for manufacturing the above thin film piezoelectric resonator, comprising:

forming an insulating layer on a semiconductor substrate in contact with a surface of the semiconductor substrate; and then performing ultraviolet ray irradiation.

Effects of the Invention

According to the present invention, the fixed charge density in the insulating layer is $1 \times 10^{11}$ cm$^{-2}$ or less. With this configuration, a thin film piezoelectric resonator having a high Q value without involving reduction in the impedance at the antiresonant frequency can be realized.

In the thin film piezoelectric resonator according to the present invention, the insulating layer may be formed of an insulating material mainly containing at least one material selected from the group consisting of silicon dioxide, silicon nitride, silicon oxynitride, aluminum nitride, aluminum oxynitride, aluminum oxide, zirconium oxide and tantalum oxide. With this configuration, a high quality insulating layer in which especially the fixed charge density is reduced can be formed.

In the thin film piezoelectric resonator according to the present invention, the insulating layer may have a thickness of 0.01 μm to 3.0 μm. With this configuration, a high quality insulating layer in which especially the fixed charge density is reduced can be formed.

In the thin film piezoelectric resonator according to the present invention, the semiconductor substrate may be a single crystal silicon substrate having a surface of crystal orientation of (100). With this configuration, a high quality insulating layer in which especially the fixed charge density is reduced can be formed.

In the thin film piezoelectric resonator according to the present invention, the semiconductor substrate may be a substrate in which a non-doped polycrystalline silicon layer is formed on a surface of a single crystal silicon substrate, and the insulating layer is formed on the non-doped polycrystalline silicon layer. This makes the resonator characteristics less affected by the fixed charge density in the insulating layer, thereby easily suppressing reduction in the impedance at the antiresonant frequency.

In the thin film piezoelectric resonator according to the present invention, the electrical resistivity of the semiconductor substrate may be 2000 Ω·cm or more. With this configuration, the impedance at the antiresonant frequency can be further increased.

In the thin film piezoelectric resonator according to the present invention, the piezoelectric resonator stack may have, above the upper electrode or under the lower electrode, a dielectric layer mainly containing at least one material selected from the group consisting of aluminum nitride, aluminum oxynitride, silicon nitride and sialon. With this configuration, it is possible to protect the lower electrode and/or upper electrode without involving deterioration in the resonant characteristics of the thin film piezoelectric resonator.

According to the thin film piezoelectric resonator manufacturing method, an insulating layer is formed on a semiconductor substrate in contact with a surface of the semiconductor substrate; and then thermal treatment is performed at 300° C. or more under non-oxidizing gas atmosphere. With this process, it is possible to easily reduce the fixed charge density in the insulating layer.

According to the thin film piezoelectric resonator manufacturing method, an insulating layer is formed on a semiconductor substrate in contact with a surface of the semiconductor substrate; and then ultraviolet ray irradiation is performed. With this process, it is possible to easily reduce the fixed charge density in the insulating layer.

BRIEF DESCRIPTION OF THE DRAWINGS

FIG. 3 is a cross-sectional view showing another embodiment of the thin film piezoelectric resonator according to the present invention;

FIG. 4 is a cross-sectional view showing another embodiment of the thin film piezoelectric resonator according to the present invention;

FIG. 9 is a diagram showing a relationship between the frequency and impedance of a thin film piezoelectric resonator obtained in Example 1;

FIG. 10 is a diagram showing a relationship between the fixed charge density in the insulating layer and impedance at the antiresonant frequency of the thin film piezoelectric resonator; and FIG. 11 is a diagram showing a relationship between the frequency and impedance of a thin film piezoelectric resonator obtained in Comparative example 1.

EXPLANATION OF REFERENCE NUMERALS

Figure 1A:
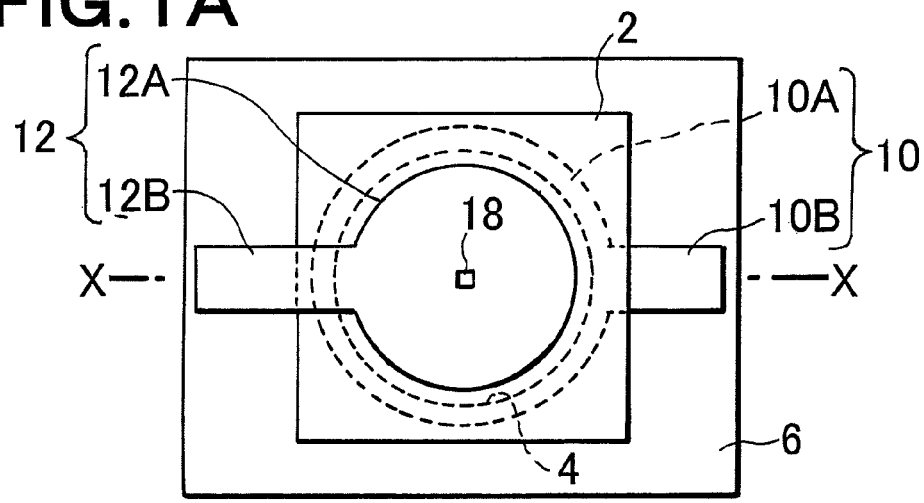
FIG. 1A is a plan view schematically showing an embodiment of a thin film piezoelectric resonator according to the present invention.

2 Piezoelectric layer
4 Oscillation space
6 Insulating layer
8 Semiconductor substrate
8A Single crystal silicon substrate
8B Non-doped polycrystalline silicon layer
10 Lower electrode
10A Lower electrode main body
10B Lower electrode connection terminal portion
12 Upper electrode
12A Upper electrode main body
12B Upper electrode connection terminal portion
14 Piezoelectric resonator stack
18 Penetrating hole for etching of sacrificial layer
22 Lower dielectric layer
24 Upper dielectric layer
26 Acoustic reflecting layer

BEST MODE FOR CARRYING OUT THE INVENTION

Embodiments of the present invention will be described with reference to the accompanying drawings. In the following description, the same or corresponding reference numerals are designated to the parts having the same functions throughout the drawing.

Figure 1B:
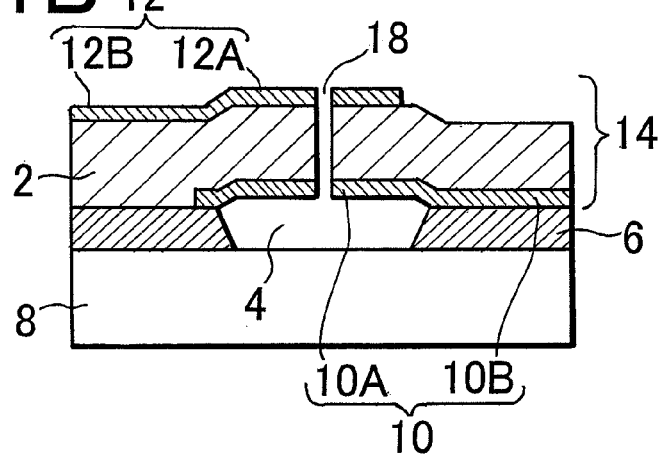
FIG. 1B is a cross-sectional view taken along the line X-X of FIG. 1A.

FIG. 1A is a plan view schematically showing an embodiment of a thin film piezoelectric resonator according to the present invention, and FIG. 1B is a cross-sectional view taken along the line X-X of FIG. 1A. The thin film piezoelectric resonator according to the present embodiment includes a semiconductor substrate 8 made of a semiconductor such as silicon, an insulating layer 6 formed on the semiconductor substrate 8 in contact with the surface (upper surface) of the semiconductor substrate 8, and a piezoelectric resonator stack 14 formed above the insulating layer 6 and including a lower electrode 10, a piezoelectric layer 2 and an upper electrode 12 in this order from the insulating layer 6 side.

An oscillation space 4 is formed between the semiconductor substrate 8 and piezoelectric resonator stack 14 as a cavity where the insulating layer 6 is absent. The oscillation space 4 is formed corresponding to an oscillation region where the lower electrode 10 and upper electrode 12 of the piezoelectric resonator stack 14 overlap each other in the thickness direction. The upper side of the piezoelectric resonator stack 14 wholly contacts the atmosphere. Therefore, the oscillation region of the piezoelectric resonator stack 14 corresponding to the oscillation space 4 is allowed to undergo oscillation. The oscillation region of the piezoelectric resonator stack 14 and oscillation space 4 each have a circular planar shape (circular shape as viewed from above) and have a diameter of e.g., 50 μm to 400 μm. Although the oscillation region of the piezoelectric resonator stack 14 and oscillation space 4 each have a circular planar shape in the present embodiment, they may each have a rectangular planar shape such as a square, an oblong, a trapezoid, or a planar shape constituted by a regular or irregular curves or straight lines in the present invention.

The lower electrode 10 has a patterned shape and includes a circular main body 10A and a connection terminal portion 10B. Similarly, the upper electrode 12 has a patterned shape and includes a circular main body 12A and a connection terminal portion 12B. The lower electrode main body 10A has a planar dimension (dimension as viewed from above) slightly larger than that of the oscillation space 4, that is, has a diameter slightly larger than that of the oscillation space 4 and covers the oscillation space 4 from above. The upper electrode main body 12A has a planar dimension (dimension as viewed from above) slightly smaller than that of the oscillation space 4, that is, has a diameter slightly smaller than that of the oscillation space 4 and is positioned corresponding to the oscillation space 4 and lower electrode main body 10A. The oscillation region of the piezoelectric resonator stack 14 is a region where the lower electrode main body 10A and upper electrode main body 12A overlap each other through the piezoelectric layer 2. As described above, the piezoelectric resonator stack 14 has a layered structure of the lower electrode 10, piezoelectric layer 2 and upper electrode 12 in the entire oscillation region, while in regions other than the oscillation region, the piezoelectric resonator stack 14 has a single layer of only the piezoelectric layer 2, a layered structure of the piezoelectric layer 2 and lower electrode 10, or a layered structure of the piezoelectric layer 2 and upper electrode 12.

The oscillation space 4 communicates with the outside air through a penetrating small hole 18 penetrating the layered structure of the upper electrode 12, piezoelectric layer 2 and lower electrode 10 of the piezoelectric resonator stack 14 in the vertical direction.

In the thin film piezoelectric resonator according to the present embodiment, the fixed charge density in the insulating layer 6 is $1 \times 10^{11}$ cm$^{-2}$ or less. Hereinafter, fixed charges and its density in the insulating layer 6 will be described.

Figure 7A:
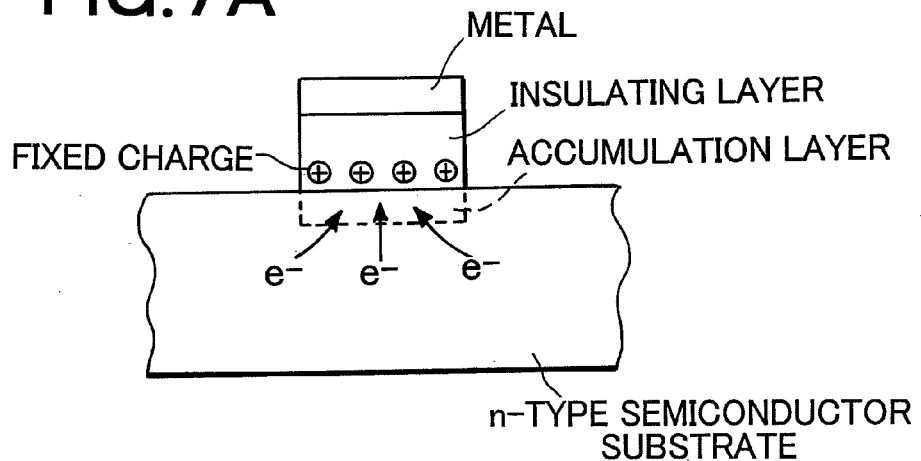
FIG. 7A is a view schematically showing influence of fixed charges on an n-type semiconductor substrate and insulating layer.
Figure 7B:
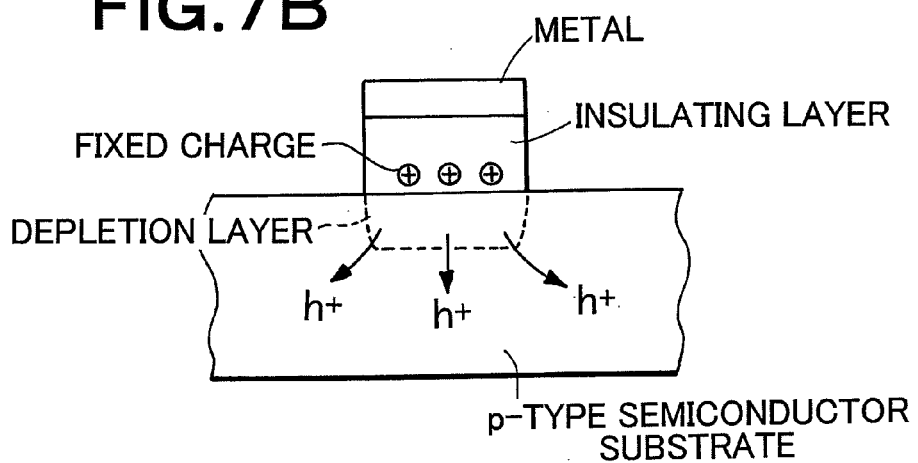
FIG. 7B is a view schematically showing influence of fixed charges on a p-type semiconductor substrate and insulating layer.
Figure 7C:
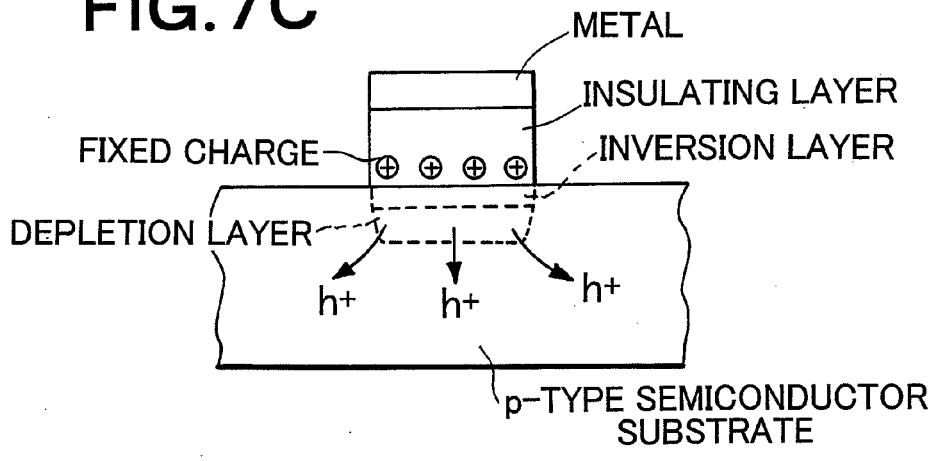
FIG. 7C is a view schematically showing influence of fixed charges on a p-type semiconductor substrate and insulating layer.

FIGS. 7A to 7C schematically show a state of fixed charges generated in the insulating layer formed in contact with the semiconductor substrate. It is known that, in the case where the insulating layer is formed in contact with the semiconductor substrate, positive charges called fixed charges generally exist in the insulating layer at the vicinity of the boundary surface between the insulating layer and semiconductor substrate. The present inventor found that the fixed charges affect the characteristics of the thin film piezoelectric resonator. The present invention has been made based on this finding and aims to provide a thin film piezoelectric resonator suppressing reduction in the impedance at the antiresonant frequency and having a high Q value by appropriately controlling the density of the fixed charges.

When a positive charge exists in the insulating layer at the vicinity of the boundary surface between the insulating layer and semiconductor substrate, if the semiconductor substrate is an n-type semiconductor substrate, electrons which are majority carriers in the semiconductor substrate gather in the vicinity of the boundary surface as shown in FIG. 7A. This phenomenon is called accumulation. An accumulation layer formed on the surface of the semiconductor works as a low resistivity layer with a low electrical resistivity. In the case where the thin film piezoelectric resonator is produced by forming the piezoelectric resonator stack on the insulating layer on the semiconductor substrate on the surface of which the accumulation layer is formed, reduction in the impedance at the antiresonant frequency may occur. Further, as shown in FIG. 7B, in the case of a p-type semiconductor substrate, holes which are majority carriers are excluded from the semiconductor substrate surface by Coulombic force, resulting in formation of a depletion layer. Further, as shown in FIG. 7C, when the number of the fixed charges in the insulating layer is increased, electrons which are minor carriers gather on the semiconductor substrate surface, resulting in formation of an inversion layer. The inversion layer formed on the semiconductor substrate surface works as a low resistivity layer with a low electrical resistivity and causes deterioration in the characteristics of the thin film piezoelectric resonator as in the case of the accumulation layer.

In the thin film piezoelectric resonator according to the present invention, the fixed charge density in the insulating layer 6 is set to $1\times10^{11}$ cm$^{-2}$ or less, so that it is possible to reduce the carrier density in the accumulation layer or inversion layer, thereby achieving a high Q value without involving reduction in the impedance at the antiresonant frequency. The lower limit value of the fixed charge density in the insulating layer 6 is 0 cm$^{-2}$ which is the theoretical limit value.

Figure 8A:
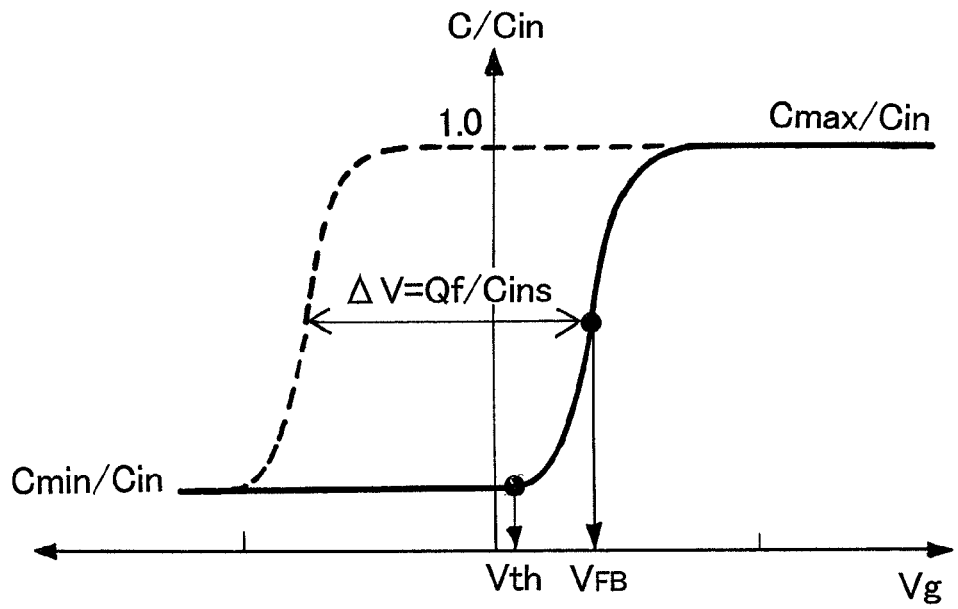
FIG. 8A is a diagram schematically showing a C-V curve in the configuration including metal, insulating layer and n-type semiconductor substrate.
Figure 8B:
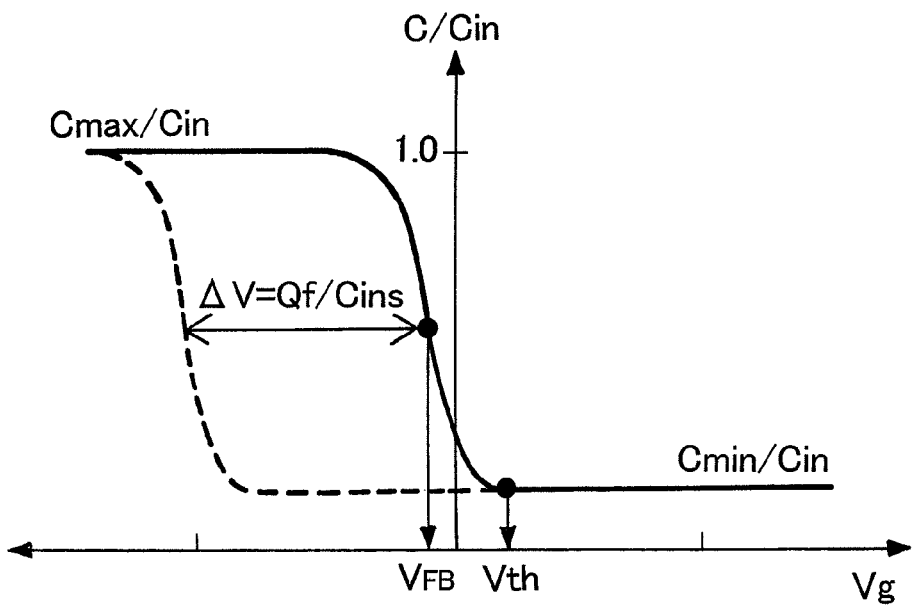
FIG. 8B is a diagram schematically showing a C-V curve in the configuration including metal, insulating layer and p-type semiconductor substrate.

The density of the fixed charges in the insulating layer 6 can be calculated as follows. FIG. 8A is a diagram showing C-V characteristics between the electrode formed on the insulating layer 6 and n-type semiconductor substrate. A dotted curve in FIG. 8A is a theoretical C-V curve obtained in the case where no fixed charge is generated. A solid curve in FIG. 8A is a C-V curve measured in the case where fixed charges are generated. In the case where the fixed charges are generated in the insulating layer 6, the C-V curve shifts to the right side (positive voltage side) with respect to the theoretical C-V curve and, based on shift amount $\Delta V$ of the flat band voltage from the theoretical value and insulating layer capacitance $C_{ins}$ calculated from the permittivity and thickness of the insulating layer, the fixed charge density can be calculated using the following equation (1). FIG. 8B is a diagram showing C-V curves in the case where a p-type semiconductor substrate is used. Also in the p-type semiconductor substrate, the C-V curve measured in the case where fixed charges are generated shifts to the right side (positive voltage side) with respect to the theoretical C-V curve and, based on shift amount $\Delta V$ of the flat band voltage and insulating layer capacitance $C_{ins}$, the fixed charge density can be calculated using the following equation (1).

$$\Delta V = Q_f/C_{ins} \quad (1)$$

$\Delta V$: Shift amount of flat band voltage from theoretical C-V curve $Q_f$: Fixed charge density $C_{ins}$: Insulating layer capacitance In the thin film piezoelectric resonator according to the present invention, the insulating layer 6 is preferably formed of an insulating material mainly containing at least one material selected from the group consisting of silicon dioxide (SiO$_2$), silicon nitride (Si$_3$N$_4$), silicon oxynitride (Si$_2$ON$_2$), aluminum nitride (AlN), aluminum oxynitride (AlO$_x$N$_y$ (values of x and y satisfy, e.g., 0.9<x<1.4 and 0.1<y<0.5, respectively)), aluminum oxide (Al$_2$O$_3$), zirconium oxide (ZrO$_2$) and/or tantalum oxide (Ta$_2$O$_5$) and/or the insulating layer 6 preferably has a thickness of 0.01 μm to 3.0 μm. With this configuration, it is possible to further reduce the density of the fixed charges generated in the insulating layer 6. The term "mainly containing" used in the present invention means that the content in the layer is 50 mol % or more. Further, a single crystal silicon substrate having a surface of crystal orientation of (100) is preferably used as the semiconductor substrate 8. By doing so, it is possible to further reduce the density of the fixed charges generated in the insulating layer 6.

Further, in the thin film piezoelectric resonator according to the present invention, a condition in which the electrical resistivity of the semiconductor substrate 8 is set to 2000 Ω·cm or more is preferably adopted in combination with the condition in which the fixed charge density in the insulation layer 6 is set to $1\times10^{11}$ cm$^{-2}$ or less. This can eliminate influence of the low resistivity layer of the semiconductor substrate 8, whereby a thin film piezoelectric resonator having a high Q value without involving reduction in the impedance at the antiresonant frequency can be obtained. The upper limit value of the electrical resistivity of the semiconductor substrate 8 can be set to, e.g., 500,000Ω·cm.

The thin film piezoelectric resonator according to the present invention can be produced as follows. An insulating layer is formed on the semiconductor substrate 8 such as a silicon substrate using a film formation technique such as sputtering or CVD method. In the case where the insulating layer is made of SiO$_2$, a thermal oxidation process may be used for formation of the insulating layer. After that, a sacrificial layer which is easily dissolved in etching solution is formed using a film formation technique such as sputtering or vapor deposition, and patterning is applied, using a patterning technique such as wet etching, RIE, or lift-off, such that the sacrificial layer remains at a portion where the oscillation space 4 is to be formed. The sacrificial layer may be a metal such as germanium (Ge), aluminum (Al), titanium (Ti), magnesium (Mg) or oxide thereof. Thereafter, the lower electrode 10, piezoelectric layer 2 and upper electrode 12 are formed using a film formation technique such as sputtering or vapor deposition and, patterning is applied to the respective layers using a patterning technique such as wet etching, RIE or lift-off. The lower electrode and upper electrode may be made of a metal material capable of being formed into a thin film and capable of being subjected to patterning, such as aluminum (Al), tungsten (W), molybdenum (Mo), platinum (Pt), ruthenium (Ru), iridium (Ir), gold (Au) or laminated body thereof. Thereafter, the penetrating hole 18 is formed so as to extend from the upper surface of the upper electrode to the sacrificial layer using the above-mentioned patterning technique, and the sacrificial layer is removed by means of etching solution supplied through the penetrating hole 18. Further, etching solution capable of etching the insulating layer is selected, followed by etching of the insulating layer by means of the etching solution, whereby the insulating layer is etched with the same pattern as that of the sacrificial layer. Thus, the oscillation space 4 is formed at the portion where the sacrificial layer and insulating layer have been removed.

Two approaches can be taken as a method for forming the insulating layer 6 in which the fixed charge density is reduced to $1\times10^{11}$ cm$^{-2}$ or less. The first one is a method that forms an insulating layer in contact with the semiconductor substrate 8 and then applies thermal treatment to the insulating layer at 300° C. or more under non-oxidizing gas atmosphere. This thermal treatment can be carried out, irrespective of presence or absence of the piezoelectric resonator stack on the insulating layer, as long as the insulating layer has been formed in contact with the semiconductor substrate 8. Therefore, the thermal treatment may be performed in the course of formation step of the basic structure of the thin film piezoelectric resonator or after the basic structure of the thin film piezoelectric resonator has been formed. That is, after the insulating layer formation step, the thermal treatment is applied to the insulating layer at 300° C. or more under non-oxidizing gas atmosphere such as N$_2$, Ar, N$_2$/H$_2$ mixed gas or Ar/H$_2$ mixed gas. The thermal treatment may be performed at a temperature of 300° C. or more, preferably, 600° C. or less. This is because that when the thermal treatment temperature exceeds 600° C., the reduction of the fixed charge density becomes small and, at the same time, if aluminum (Al) is used as a material of the electrode constituting the thin film piezoelectric resonator, grain growth tends to occur during high-temperature thermal treatment.

The second method for forming the insulating layer 6 in which the fixed charge density is reduced to $1\times10^{11}$ cm$^{-2}$ or less is a method that forms an insulating layer in contact with the semiconductor substrate 8 and then irradiates the insulating layer with ultraviolet ray. This irradiation of ultraviolet ray can be carried out, irrespective of presence or absence of the piezoelectric resonator stack on the insulating layer, as long as the insulating layer has been formed in contact with the semiconductor substrate 8. Therefore, the irradiation of ultraviolet ray may be performed in the course of formation step of the basic structure of the thin film piezoelectric resonator or after the basic structure of the thin film piezoelectric resonator has been formed. That is, after the insulating layer formation step, ultraviolet ray is irradiated onto the insulating layer at an irradiation intensity of 100 mW/cm$^2$ or more. The irradiation intensity of ultraviolet ray may be 100 mW/cm$^2$ or more, preferably, 10 W/cm$^2$ or less. This is because that when the irradiation intensity of ultraviolet ray exceeds 10 W/cm$^2$, the reduction of the fixed charge density becomes small.

Figure 2:
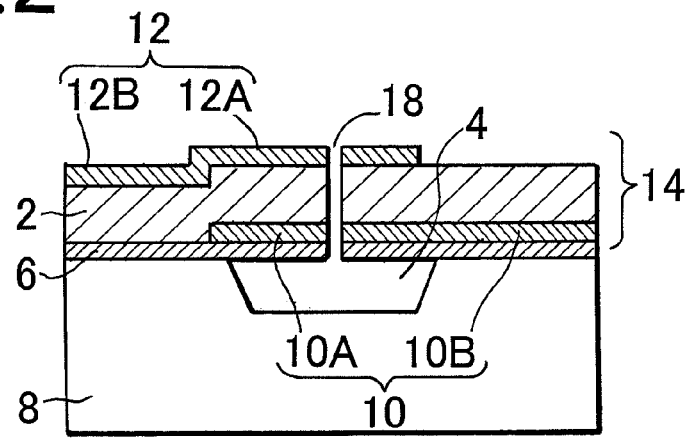
FIG. 2 is a cross-sectional view showing another embodiment of the thin film piezoelectric resonator according to the present invention.

In addition to the embodiment shown in FIGS. 1A and 1B, other embodiments as shown in FIGS. 2 and 3 are possible. FIGS. 2 and 3 are each a cross-sectional views showing another embodiment of the thin film piezoelectric resonator according to the present invention. The oscillation space 4 is formed in the insulating layer 6 in the embodiment shown in FIGS. 1A and 1B, while in the embodiment shown in FIG. 2, the oscillation space 4 is formed in the semiconductor substrate 8. Other configurations are the same as those of the embodiment shown in FIGS. 1A and 1B. The embodiment shown in FIG. 3 is the same as the embodiment shown in FIG. 2 in that the oscillation space 4 is formed in the semiconductor substrate 8 but differs therefrom in that the oscillation space 4 penetrates the semiconductor substrate 8. Further, the sacrificial layer is not used for production of the thin film piezoelectric resonator, so that the penetrating hole for etching is not formed in the piezoelectric resonator stack 14. Other configurations are the same as those of the embodiment shown in FIGS. 1A and 1B. Thus, in the embodiments shown in FIGS. 2 and 3, the insulating layer 6 exists also above the oscillation space 4.

The thin film piezoelectric resonator shown in FIG. 2 can be produced as follows. A pit portion is formed in the surface of the semiconductor substrate 8 such as a silicon substrate using wet etching or the like, and then a sacrificial layer is formed using a film formation technique such as a CVD method. After that, the entire surface of the sacrificial layer and substrate is flattened using a flattening technique such as a CMP method so that the sacrificial layer remains only in the pit portion. The sacrificial layer is preferably made of an easily etched material such as PSG (Phospho-silicate glass). Then, after an insulating layer is formed using a film formation method such as sputtering, vapor deposition, or CVD method, or a thermal oxidation process, the lower electrode 10, piezoelectric layer 2 and upper electrode 12 are formed using the above-mentioned film formation technique and, then patterning is applied to the respective layers using a patterning technique such as wet etching, RIE or lift-off. Thereafter, the penetrating hole 18 is formed so as to extend from the upper side to the sacrificial layer using the above-mentioned patterning technique, and the sacrificial layer is removed by means of etching solution supplied through the penetrating hole 18. As a result, the oscillation space 4 is formed in the pit portion. Note that the method for forming the insulating layer 6 in which the fixed charge density is reduced to 1×10$^{11}$ cm$^{-2}$ or less is the same as described above.

The thin film piezoelectric resonator shown in FIG. 3 can be produced as follows. An insulating layer is formed on the surface of the semiconductor substrate 8 such as a silicon substrate using a film formation technique such as sputtering, vapor deposition, or CVD method, or a thermal oxidation process. After that, the lower electrode 10, piezoelectric layer 2 and upper electrode 12 are formed using the above-mentioned film formation method and, then patterning is applied to the respective layers using a patterning technique such as wet etching, RIE or lift-off. Thereafter, etching is effected from the rear surface (lower surface) of the semiconductor substrate 8 up to the lower part of the insulating layer using an anisotropic wet etching or deep-etching technique such as Deep-RIE to thereby form the oscillation space 4. Note that the method for forming the insulating layer 6 in which the fixed charge density is reduced to 1×10$^{11}$ cm$^{-2}$ or less is the same as described above.

FIG. 4 shows another embodiment of the thin film piezoelectric resonator according to the present invention. In this thin film piezoelectric resonator, as shown in FIG. 4, the semiconductor substrate 8 is a substrate obtained by forming a non-doped polycrystalline silicon layer 8B on a single crystal silicon substrate 8A, and the insulating layer 6 is formed on the non-doped polycrystalline silicon layer 8B. When the insulating layer 6 is formed on the non-doped polycrystalline silicon layer 8B, the non-doped polycrystalline silicon layer 8B acts as a carrier trap layer, making it difficult to form the accumulation layer or inversion layer. As a result, a thin film piezoelectric resonator having a high Q value without involving reduction in the impedance at the antiresonant frequency can be obtained. The embodiment shown in FIG. 4 is the same as the embodiment shown in FIGS. 1A and 1B except that the non-doped polycrystalline silicon layer BB is formed and can be produced using the same method.

Figure 5A:
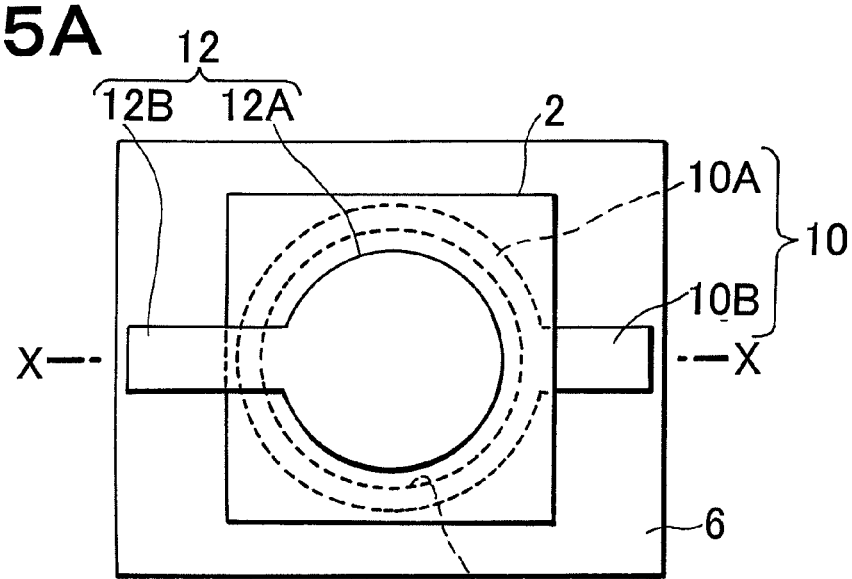
FIG. 5A is a plan view schematically showing another embodiment of the thin film piezoelectric resonator according to the present invention.
Figure 5B:
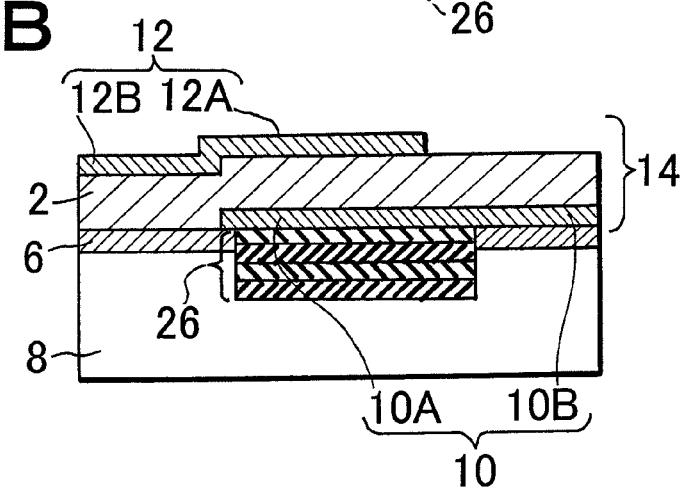
FIG. 5B is a cross-sectional view taken along the line X-X of FIG. 5A.

Further, as another embodiment of the present invention, an embodiment as shown in FIGS. 5A and 5B is possible. FIG. 5A is a plan view schematically showing the present embodiment, and FIG. 5B is a cross-sectional view taken along the line X-X in FIG. 5A. The oscillation space 4 is formed under the piezoelectric resonator stack 14 in the embodiments shown in FIGS. 1 (1A and 1B) to 4, while in the embodiment shown in FIGS. 5A and 5B, an acoustic reflecting layer 26 is formed under the piezoelectric resonator stack 14. Other configurations are the same as those of the embodiment shown in FIGS. 1A and 1B.

The thin film piezoelectric resonator shown in FIGS. 5A and 5B can be produced as follows. An insulating layer is formed on the surface of the semiconductor substrate 8 such as an Si substrate using a film formation technique such as sputtering, vapor deposition, or CVD method, or a thermal oxidation process, and a pit portion is formed in the insulating layer and the semiconductor substrate 8 using wet etching or the like, followed by formation of the acoustic reflecting layer 26 using the above-mentioned film formation technique. After that, the entire surface of the insulating layer and acoustic reflecting layer 26 on the substrate is flattened using a flattening technique such as a CMP method so that the acoustic reflecting layer 26 is deposited only in the pit portion. A low impedance layer included in the acoustic reflecting layer 26 is preferably made of a material having a small acoustic impedance, such as SiO$_2$ or AlN, and a high impedance layer included in the acoustic reflecting layer 26 is preferably made of a material having a large acoustic impedance, such as Mo, W or Ta$_2$O$_5$. The acoustic reflecting layer 26 is obtained by alternately stacking the low impedance layers and high impedance layers such that the thicknesses thereof respectively corresponds to ¼ wavelength of the elastic wave. Then, the lower electrode 10, piezoelectric layer 2 and upper electrode 12 are formed using a film formation method such as sputtering or vapor deposition, and then patterning is applied to the respective layers using a patterning technique such as wet etching, RIE or lift-off, whereby the thin film piezoelectric resonator shown in FIGS. 5A and 5B can be obtained. Note that the method for forming the insulating layer 6 in which the fixed charge density is reduced to 1×10$^{11}$ cm$^{-2}$ or less is the same as described above.

Figure 6:
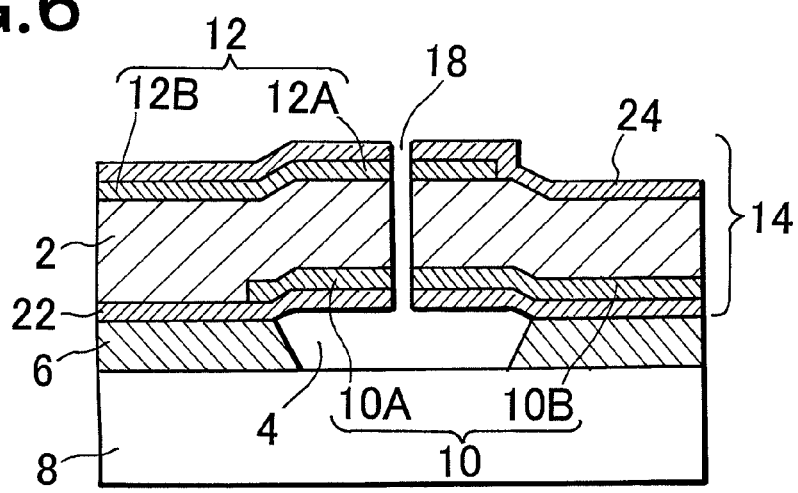
FIG. 6 is a cross-sectional view showing another embodiment of the thin film piezoelectric resonator according to the present invention.

FIG. 6 shows another embodiment of the thin film piezoelectric resonator according to the present embodiment. In this thin film piezoelectric resonator, as shown in FIG. 6, a dielectric layer 22 is formed under the lower electrode 10 and a dielectric layer 24 is formed above the upper electrode 12. The dielectric layer may be formed only on one side of either the underside of the lower electrode or upside of the upper electrode. In the present embodiment, the piezoelectric resonator stack 14 includes the dielectric layers. In the present invention, the insulating layer 6 and lower dielectric layer 22 are distinguished from each other such that a dielectric layer that does not directly contact the semiconductor substrate 8 is defined as the lower dielectric layer 22 and a dielectric layer that directly contacts the semiconductor substrate 8 is defined as the insulating layer 6. The lower dielectric layer 22 and upper dielectric layer 24 are each preferably made of a material having a comparatively high elasticity, such as aluminum nitride (AlN), aluminum oxynitride ($AlO_xN_y$ (values of x and y satisfy, e.g., 0.9<x<1.4 and 0.1<y<0.5, respectively)), silicon nitride ($Si_3N_4$) or sialon (SiAlON) and are each preferably formed as a dielectric layer mainly containing at least one material selected from the group consisting of the above materials. Other configurations are the same as those of the embodiment shown in FIGS. 1A and 1B, and the thin film piezoelectric resonator of the present embodiment can also be produced using the same method as the embodiment shown in FIGS. 1A and 1B.

As in the case of the embodiments shown in FIGS. 1 (1A and 1B) to 5 (5A and 5B), according to the present embodiment in which the lower dielectric layer 22 and/or upper dielectric layer 24 is/are formed, a thin film piezoelectric resonator suppressing reduction in the impedance at the antiresonant frequency and having a high Q value can be obtained. Further, by forming the lower dielectric layer 22 and/or upper dielectric layer 24, it is possible to protect the lower electrode 10 and/or upper electrode 12.

EXAMPLE

Example 1

A thin film piezoelectric resonator according to the embodiment shown in FIGS. 1A and 1B, in which the diameter of the oscillation region is set to 200 μm, was produced. The materials and thickness of the layer constituting the thin film piezoelectric resonator of this example were set as follows. The insulating layer 6 was made of $SiO_2$ having a thickness of 1 μm, the lower electrode 10 was made of Mo having a thickness of 300 nm, the piezoelectric layer 2 was made of AlN having a thickness of 1,200 nm, and the upper electrode 12 was formed as a laminated electrode including a layer made of Mo having a thickness of 150 nm and a layer made of Al having a thickness of 150 nm. Further, as the semiconductor substrate 8 used in this example, an n-type Si substrate having an electrical resistivity of 2000 Ω·cm and having a surface of crystal orientation of (100) was used. Thermal treatment was carried out at 400° C. under an atmosphere of $N_2/H_2$ mixed gas at the final stage of the production process. As described with reference to FIG. 8A, the C-V characteristics between the lower electrode 10 and Si substrate 8 was measured to calculate the fixed charge density. The result was $3 \times 10^{10}$ $cm^{-2}$. FIG. 9 shows a relationship between the frequency (Frequency) and impedance (Z) in the produced thin film piezoelectric resonator. The impedance at the antiresonant frequency was 2700Ω, and Q value was 980, which exhibited favorable resonator characteristics.

FIG. 10 shows a relationship between the fixed charge density and impedance at the antiresonant frequency obtained in the case where a condition of thermal treatment performed under an atmosphere of $N_2/H_2$ mixed gas or a condition of ultraviolet ray irradiation performed in place of or in combination with the thermal treatment is variously changed. As can be seen from FIG. 10, in the region where the fixed charge density is $1 \times 10^{11}$ $cm^{-2}$ or less, the reduction of the impedance at the antiresonant frequency is small, whereby favorable resonant characteristics can be obtained.

Comparative Example 1

A thin film piezoelectric resonator was produced in the same manner except that the thermal treatment under an atmosphere of $N_2/H_2$ mixed gas was not performed. The obtained fixed charge density was $5 \times 10^{11}$ $cm^{-2}$. FIG. 11 shows a relationship between the frequency and impedance in the produced thin film piezoelectric resonator. The impedance at the antiresonant frequency was reduced to 1200Ω as compared to 2700Ω for the example 1 and Q value was deteriorated to 600 as compared to 980 for the example 1.

What is claimed is:

1. A thin film piezoelectric resonator comprising:
a semiconductor substrate;
an insulating layer formed on the semiconductor substrate in contact with a surface of the semiconductor substrate; and
a piezoelectric resonator stack formed above the insulating layer and having a lower electrode, a piezoelectric layer and an upper electrode in this order from the insulating layer side,
wherein the electrical resistivity of the semiconductor substrate is 2000 Ω·cm or more, and a fixed charge density in the insulating layer is $1 \times 10^{11}$ $cm^{-2}$ or less; and
wherein an oscillating space is formed as an enclosed cavity in one of the semiconductor substrate and the insulating layer, the oscillating space in communication with the outside air through a hole penetrating at least the layered structure of the upper electrode, the piezoelectric layer, and the lower electrode into the oscillating space.

2. The thin film piezoelectric resonator according to claim 1, wherein the insulating layer is formed of an insulating material mainly containing at least one material selected from the group consisting of silicon dioxide, silicon nitride, silicon oxynitride, aluminum nitride, aluminum oxynitride, aluminum oxide, zirconium oxide and tantalum oxide.

3. The thin film piezoelectric resonator according to claim 1, wherein the insulating layer has a thickness of 0.01 μm to 3.0 μm.

4. The thin film piezoelectric resonator according to claim 1, wherein the semiconductor substrate is a single crystal silicon substrate having a surface of crystal orientation of (100).

5. The thin film piezoelectric resonator according to claim 1, wherein the semiconductor substrate is a substrate in which a non-doped polycrystalline silicon layer is formed on a surface of a single crystal silicon substrate, and the insulating layer is formed on the non-doped polycrystalline silicon layer.

6. The thin film piezoelectric resonator according to claim 1, wherein the piezoelectric resonator stack has, above the upper electrode or under the lower electrode, a dielectric layer mainly containing at least one material selected from the group consisting of aluminum nitride, aluminum oxynitride, silicon nitride, and sialon.

7. A method for manufacturing the thin film piezoelectric resonator claimed in claim 1, comprising:
forming an insulating layer on a semiconductor substrate in contact with a surface of the semiconductor substrate; and
then performing thermal treatment at 300° C. or more under non-oxidizing gas atmosphere.

8. A method for manufacturing the thin film piezoelectric resonator claimed in claim 1, comprising:
forming an insulating layer on a semiconductor substrate in contact with a surface of the semiconductor substrate; and
then performing ultraviolet ray irradiation.

* * * * *